(12) United States Patent
Lee et al.

(10) Patent No.: US 7,511,257 B2
(45) Date of Patent: Mar. 31, 2009

(54) METHOD AND APPARATUS PROVIDING AND OPTICAL GUIDE IN IMAGE SENSOR DEVICES

(75) Inventors: Ji Soo Lee, San Jose, CA (US); Jeff A. Mckee, Meridian, ID (US); Chandra Mouli, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 11/209,777

(22) Filed: Aug. 24, 2005

(65) Prior Publication Data

US 2007/0045511 A1   Mar. 1, 2007

(51) Int. Cl.
*H01L 31/00* (2006.01)

(52) U.S. Cl. .................. 250/214.1; 250/208.1; 257/294

(58) Field of Classification Search .............. 250/208.1; 257/294; 448/65; 438/65
See application file for complete search history.

(56) References Cited

U.S. PATENT DOCUMENTS

| | | | | |
|---|---|---|---|---|
| 5,239,172 | A * | 8/1993 | Yokota et al. | 250/208.1 |
| 6,075,237 | A * | 6/2000 | Ciccarelli | 250/208.1 |
| 6,140,630 | A | 10/2000 | Rhodes | |
| 6,177,333 | B1 | 1/2001 | Rhodes | |
| 6,204,524 | B1 | 3/2001 | Rhodes | |
| 6,239,421 | B1 * | 5/2001 | Nagata et al. | 250/208.1 |
| 6,310,366 | B1 | 10/2001 | Rhodes et al. | |
| 6,326,652 | B1 | 12/2001 | Rhodes | |
| 6,333,205 | B1 | 12/2001 | Rhodes | |
| 6,766,082 | B2 * | 7/2004 | Hirabayashi et al. | 385/40 |
| 7,078,779 | B2 * | 7/2006 | Wang et al. | 257/432 |
| 2002/0110948 | A1 * | 8/2002 | Huang et al. | 438/57 |
| 2003/0122209 | A1 * | 7/2003 | Uya | 257/435 |
| 2003/0210342 | A1 | 11/2003 | Parks | |
| 2004/0080007 | A1 * | 4/2004 | Yamamoto | 257/432 |
| 2004/0140564 | A1 * | 7/2004 | Lee et al. | 257/758 |
| 2004/0180451 | A1 | 9/2004 | Yaung et al. | |
| 2004/0183436 | A1 | 9/2004 | Ito et al. | |
| 2005/0045928 | A1 * | 3/2005 | Kuriyama | 257/294 |

(Continued)

FOREIGN PATENT DOCUMENTS

EP     1 396 888     3/2004

(Continued)

OTHER PUBLICATIONS

Hsu et al., Light Guide for Pixel Crosstalk Improvement in Deep Submicron CMOS Image Sensor, Jan. 2004, IEEE, vol. 25, No. 1, p. 1.*

(Continued)

*Primary Examiner*—Stephen Yam
(74) *Attorney, Agent, or Firm*—Dickstein Shapiro LLP (57) ABSTRACT

A device and method for providing an optical guide of a pixel to guide incoming light to/from a photo-conversion device of the pixel to improve the optical crosstalk immunity. The optical guide includes an optically reflecting barrier formed as a trench filled with a material which produces reflection. The trench fill material may have an index of refraction that is less than the index of refraction of the material used for the trench surrounding layers to provide a light reflective structure or the trench fill material may provide a reflection surface.

36 Claims, 11 Drawing Sheets

U.S. PATENT DOCUMENTS

| | | | |
|---|---|---|---|
| 2005/0051817 A1* | 3/2005 | Morita et al. | 257/294 |
| 2005/0056901 A1* | 3/2005 | Kuriyama | 257/428 |
| 2005/0072906 A1 | 4/2005 | Dobashi | |
| 2005/0236553 A1* | 10/2005 | Noto et al. | 250/208.1 |
| 2005/0263676 A1* | 12/2005 | Jeon | 250/208.1 |

FOREIGN PATENT DOCUMENTS

| | | |
|---|---|---|
| JP | 06163863 A * | 6/1994 |
| JP | 2000-124438 | 4/2000 |
| JP | 2001-044401 | 2/2001 |
| KR | 2005-0032448 | 4/2005 |

OTHER PUBLICATIONS

English Translation of JP06163863, Dec. 2007.*

Mendis, et al., "CMOS Active Pixel Image Sensor", IEEE Transactions on Electron Devices, vol. 41, No. 3, Mar. 1994, pp. 452-453.

Nixon et al., "256 ×256 CMOS Active Pixel Sensor Camera-on-a-Chip", IEEE Journal of Solid-State Circuits, vol. 31, No. 12, Dec. 1996, pp. 2046-2050.

T. H. Hsu et al., "Light Guide for Pixel Crosstalk Improvement in Deep Submicron CMOS Image Sensor", IEEE Electron Device Letters, vol. 25, No. 1, Jan. 2004, pp. 22-24.

Yuang et al., "Air-Gap Guard Ring for Pixel Sensitivity and Crosstalk Improvement in Deep Sub-micron CMOS Image Sensor", IEEE, 2003.

* cited by examiner

METHOD AND APPARATUS PROVIDING AND OPTICAL GUIDE IN IMAGE SENSOR DEVICES

FIELD OF THE INVENTION

The invention relates generally to solid state imaging devices and more particularly to a method and apparatus which optically isolates pixel regions to reduce optical crosstalk in a solid state image sensor.

BACKGROUND OF THE INVENTION

There are a number of different types of semiconductor-based imagers, including charge coupled devices (CCD's), photodiode arrays, charge injection devices (CID's), hybrid focal plane arrays, and complementary metal oxide semiconductor (CMOS) imagers. Current applications of solid-state imagers include cameras, scanners, machine vision systems, vehicle navigation systems, video telephones, computer input devices, surveillance systems, auto focus systems, star trackers, motion detector systems, image stabilization systems, and other image acquisition and processing systems.

CMOS imagers are well known. CMOS images are discussed, for example, in Nixon et al., "256×256 CMOS Active Pixel Sensor Camera-on-a-Chip," IEEE Journal of Solid-State Circuits, Vol. 31(12), pp. 2046-2050 (1996); Mendis et al., "CMOS Active Pixel Image Sensors," IEEE Transactions on Electron Devices, Vol. 41(3), pp. 452-453 (1994); and are also disclosed in U.S. Pat. Nos. 6,140,630, 6,204,524, 6,310,366, 6,326,652, 6,333,205, and 6,326,868; assigned to Micron Technology, Inc., the entire disclosures of which are incorporated herein by reference.

Semiconductor imaging devices include an array of pixel cells, which converts light energy received, through an optical lens, into electrical signals. Each pixel cell contains a photosensor for converting a respective portion of a received image into an electrical signal. The electrical signals produced by the array of photosensors are processed to render a digital image.

The amount of charge generated by the photosensor corresponds to the intensity of light impinging on the photosensor. Accordingly, it is important that all of the light directed to the photosensor impinges on the photosensor rather than being reflected or refracted toward another photosensor as optical crosstalk.

For example, optical crosstalk may exist between neighboring photosensors in a pixel array. In an ideal imager, ideally, all the incident photons on top of a microlens are directed towards the photosensing element underneath that microlens. In reality, some of the photons get refracted and reach adjacent photosensors. This leads to undesirable optical crosstalk between neighboring pixels. This problem gets worse with scaled pixels and as the distance between the photosensor and the microlens increases. Increasing the number of interconnect metal layers typically increases this distance.

Optical crosstalk can bring about undesirable results in the images produced by the imaging device. The undesirable results can become more pronounced as the density of a pixel cell in imager arrays increases, and as pixel cell size correspondingly decreases. The shrinking pixel cell sizes make it increasingly difficult to properly focus incoming light on the photosensor of each pixel cell without accompanying optical crosstalk.

Optical crosstalk can cause a blurring or reduction in contrast in images produced by the imaging device. Optical crosstalk also degrades the spatial resolution, reduces overall sensitivity, causes color mixing, and leads to image noise after color correction. As noted above, image degradation can become more pronounced as pixel cell and device sizes are reduced. Furthermore, degradation caused by optical crosstalk is more conspicuous at longer wavelengths of light. Light having longer wavelengths penetrates more deeply into the silicon structure of a pixel cell, providing more opportunities for the light to be reflected or refracted away from its intended photosensor target.

Figure 1:
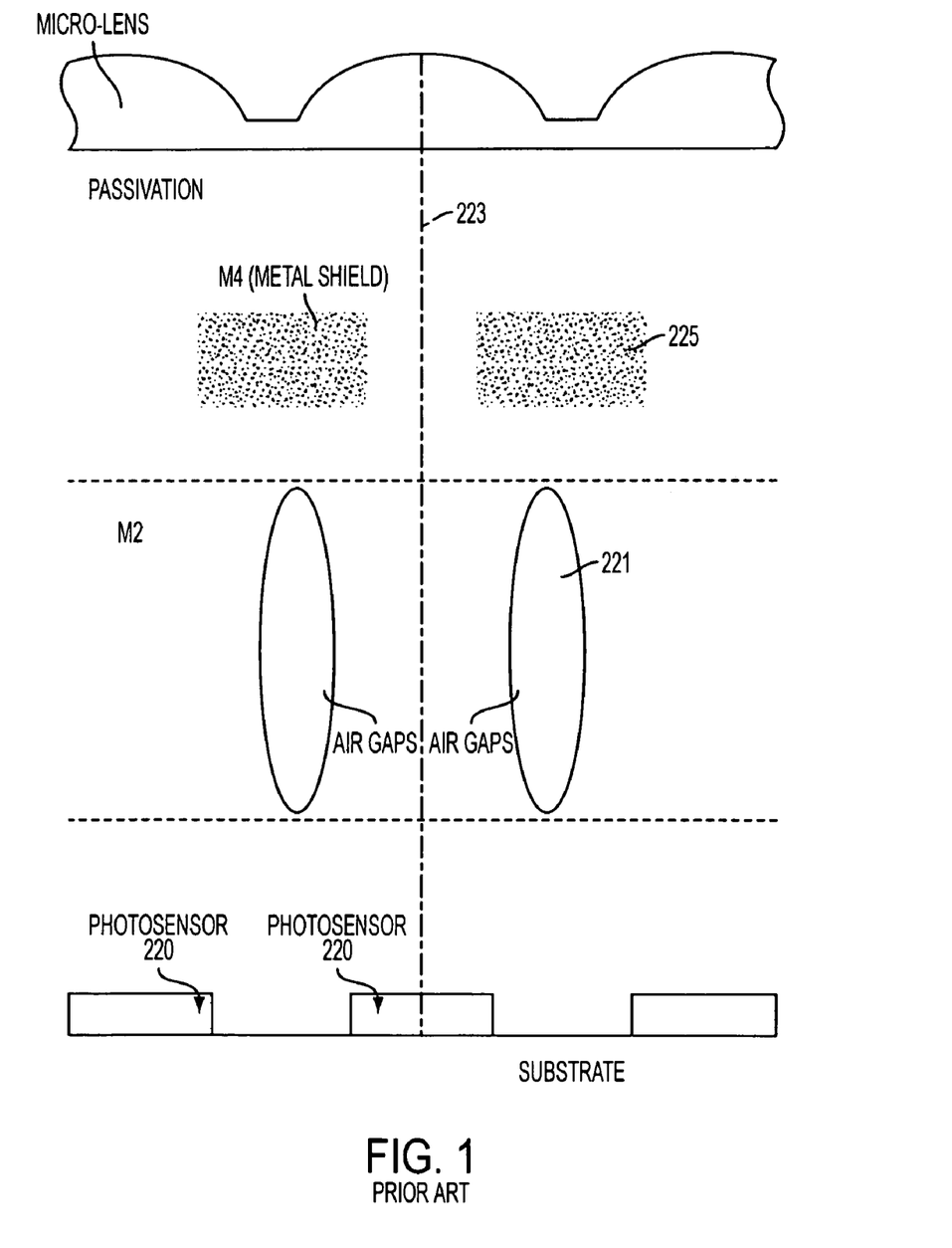
FIG. 1 illustrates a cross sectional view of a prior art pixel.

One proposal to reduce optical crosstalk provides a continuous air-gap around the optical path to a photosensor. See Dun-Nian Yaung et al., *Air-Gap Guard Ring for Pixel Sensitivity and Crosstalk Improvement in Deep Sub-micron CMOS Image Sensor*, PROC. OF IEDM, 2003; see also T. H. Hsu et al., *Light Guide for Pixel Cross Talk Improvement in Deep Sub-micron CMOS Image Sensor*, IEEE ELECTRON DEVICE LETTERS, vol. 25, no. 1, 2004, at 22-24. FIG. 1 represents a cross sectional view of an imager showing two exemplary prior art techniques for dealing with optical crosstalk. The FIG. 1 imager has an air-gap guard ring 221 surrounding a photosensor optical path 223 existing between a micro-lens 240 and a photosensor 220. The air gap ring 221 is shown as being fabricated in the lower metallization layers M2 of an imager. The air gap provides a refraction index difference between the air gap ($n_2=1$) and the surrounding dielectric layers ($n_1=1.4\sim1.6$) and thus, the majority of incident light will be collected in the targeted pixel cell due to the total internal reflection in the air-gap/dielectric film interface. However, the presence of an air gap ring 221 is not ideally suited for solid state imagers. There are several reliability issues with the air gap such as its structural instability. Also, the color filter array (CFA) process, widely used in color imager fabrication, is known to have metallic and mobile ion contaminants that might easily diffuse through the air gaps and affect the devices and photosensor characteristics in the underlying pixel circuit.

Alternatively as also shown in FIG. 1, planar metal-shielding 225 provided in an upper metallization layer M4 has been used in an effort to reduce optical crosstalk, but these may degrade pixel sensitivity and/or are not suitable for use in zooming lens systems.

Another method of reducing optical crosstalk uses optical waveguides. Optical waveguides are structures used for spatially confining and directing light onto the intended target. For instance, optical waveguides can be used to reduce the detrimental affects associated with light shields such as light piping and light shadowing. Optical waveguides, however, are not widely used to focus light directly onto the photosensor in imaging devices. Moreover, currently employed optical waveguide structures, require additional processing steps, adding to the complexity and costs of imager fabrication.

Accordingly, there is a need and desire for an improved apparatus and method for reducing optical crosstalk in imaging devices. There is also a need to more effectively and accurately increase overall pixel sensitivity and provide improved optical crosstalk immunity without adding complexity to the manufacturing process and/or increasing fabrication costs.

BRIEF SUMMARY OF THE INVENTION

Exemplary embodiments of the invention provide an optical guide structure for a pixel which guides incoming light onto the photosensor of the pixel. The optical guide structure has an optically reflecting barrier that mitigates against optical crosstalk. The optical guide structure is made of low dielectric constant material with an index of refraction that is less than the index of refraction of the material of surrounding layers. This difference in refractive index causes an internal reflection into an optical path existing between a lens and pixel.

In other exemplary embodiments, materials with high reflectivity such as metals can be used to implement the optical guide structure. In yet another embodiment, to improve the difference in the index of refraction between the fill material and the surrounding material, the surrounding layers may be formed with materials having a relatively high index of refraction

BRIEF DESCRIPTION OF THE DRAWINGS

The foregoing and other features of the invention will become more apparent from the detailed description of exemplary embodiments provided below with reference to the accompanying drawings in which.

DETAILED DESCRIPTION OF THE INVENTION

In the following detailed description, reference is made to the accompanying drawings which form a part hereof, and in which is shown by way of illustration specific embodiments by which the invention may be practiced. It should be understood that like reference numerals represent like elements throughout the drawings. These exemplary embodiments are described in sufficient detail to enable those skilled in the art to practice the invention. It is to be understood that other embodiments may be utilized, and that structural, logical and electrical changes may be made without departing from the spirit and scope of the present invention.

The terms "wafer" and "substrate" are to be understood as including all forms of semiconductor wafers and substrates including silicon, silicon-on-insulator (SOI), silicon-on-sapphire (SOS), doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on other semiconductors, for example, silicon-germanium, germanium, or gallium arsenide.

The term "pixel" refers to a picture element unit cell containing circuitry including a photosensor and semiconductors for converting electromagnetic radiation to an electrical signal. For purposes of illustration, fabrication of one or more representative pixels is shown and described. Typically, fabrication of all pixels in an imager will proceed simultaneously in a similar fashion.

Although the invention is described herein with reference to the architecture and fabrication of one or a limited number of pixels, it should be understood that this is representative of a plurality of pixel cells as typically would be arranged in an imager array having pixel cells arranged, for example, in rows and columns.

In addition, although the invention is described below with reference to a pixel for a CMOS imager, the invention has applicability to other solid-state imaging devices using pixels (e.g., a CCD or other solid state imager).

The invention may also be employed in display devices where a pixel has a light emitter for emitting light. The following detailed description is, therefore, not to be taken in a limiting sense, and the scope of the present invention is defined only by the appended claims.

Figure 2:
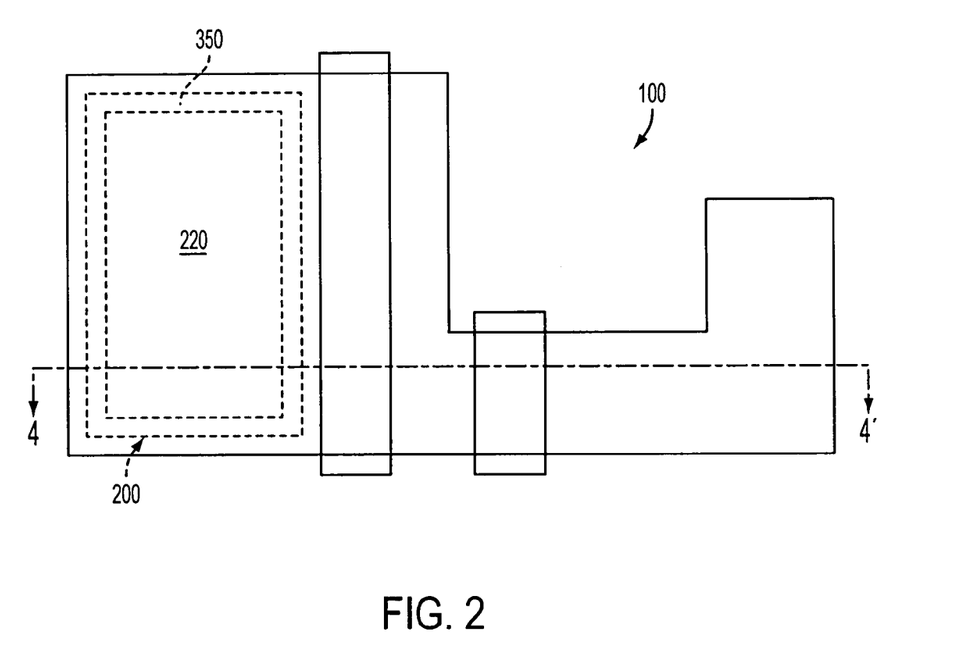
FIG. 2 is a plan view of an image sensor pixel constructed in accordance with an exemplary embodiment of the invention.
Figure 3:
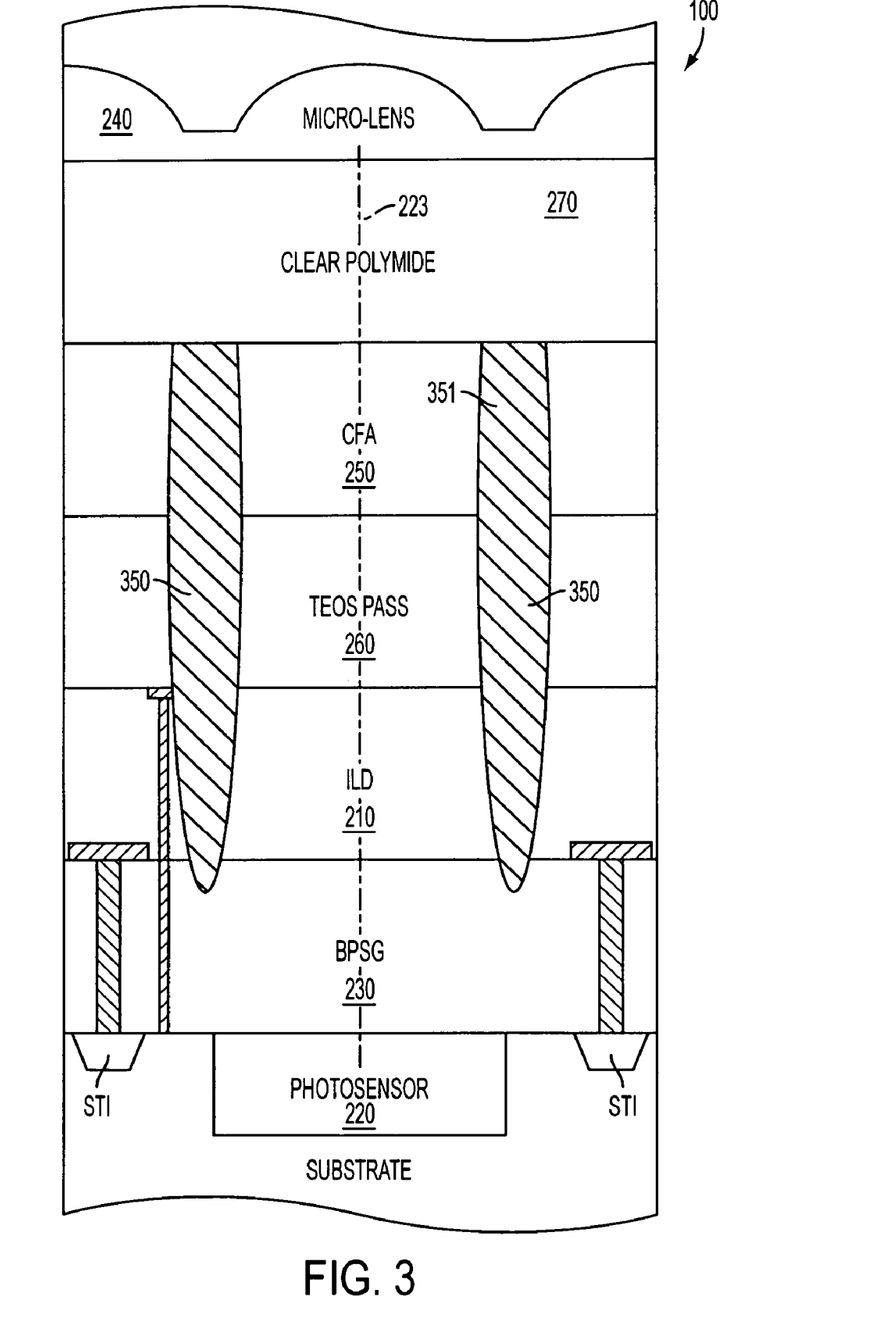
FIG. 3 shows a cross sectional view of the image sensor pixel of FIG. 2, constructed in accordance with the exemplary embodiment of the invention.

Referring to the FIG. 2 top down view and the FIG. 3 cross sectional view, embodiments of the invention provide a trench 350 filled with a material 351 designed to provide internal reflection within the optical path 223. The trench 350 and filling material 351 are formed in optical path 223 between a photosensor layer 220 formed on a substrate and a micro lens layer 240 for each pixel cell. The trench 350 and associated fill material 351 surround the optical path between a lens and a corresponding photosensor, which corresponds to a lateral area defined by the photosensor. The depth and width of the filled trench 350 can be tailored depending on the need, and may extend from the upper layers of the image sensor, for example, beginning at the color filter array 250 level, to below a bottom ILD layer 210 into the protective layer 230, formed typically of BPSG, provided above the active area of the photosensor layer 220. The trench can be etched by any method known in the art.

In a first embodiment of the invention, the trench 350 is filled with a low-dielectric constant material 440 (low-k material), having a dielectric constant below 1.45. The low dielectric constant material 440 within trench 350 has an index of refraction that is less than the index of refraction of the material used for the surrounding imager layers shown as the BPSG layer 230, ILD layers with associated metallization 210, passivation TEOS layer 260, and CFA layer 250.

For example, the dielectric of the ILD layer 210 is typically implemented by depositing amorphous silicon dioxide, whose index of refraction is approximately between 1.45 and 1.54. Thus, in this example, a material with a lower index of refraction than 1.45 will fill the trench 350. Additionally, there are numerous other low-k polymers (discussed below) that can be used for the fill material 351, as long as their respective reflective index is below that of the surrounding layers.

Figure 4:
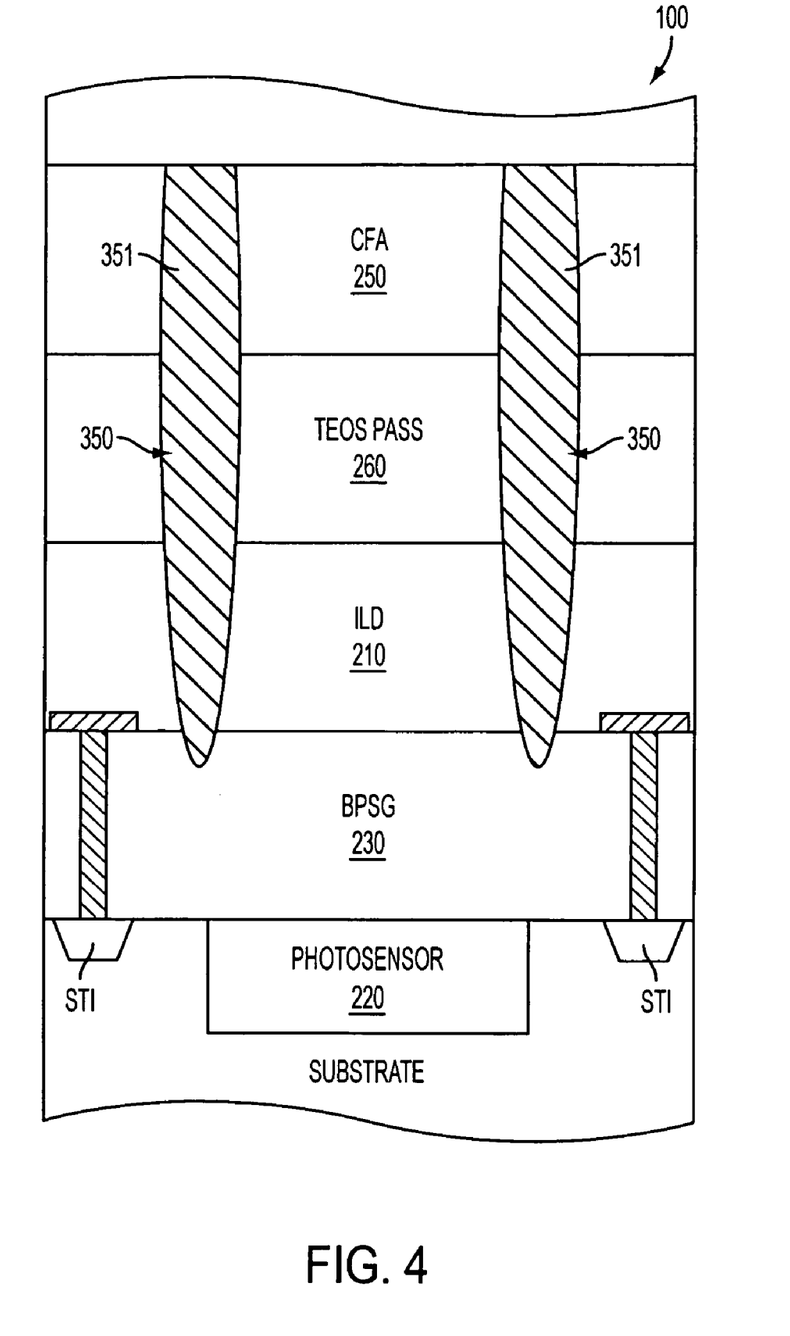
FIG. 4 shows the optical guide structure in accordance with the exemplary embodiment of the invention.

FIG. 4 illustrates the FIG. 3 structure prior to formation of an upper passivation layer 270 and micro-lens layer 240. The trench 350 may be etched through the CFA layer 250, passivation layer 260, ILD and associated metallization layers 210 and partially into the BPSG layer 230. The trench is then filled with the fill material 351 and CMP planarized, after which the passivation layer 270 and micro-lens layers 240 are added.

Figure 5:
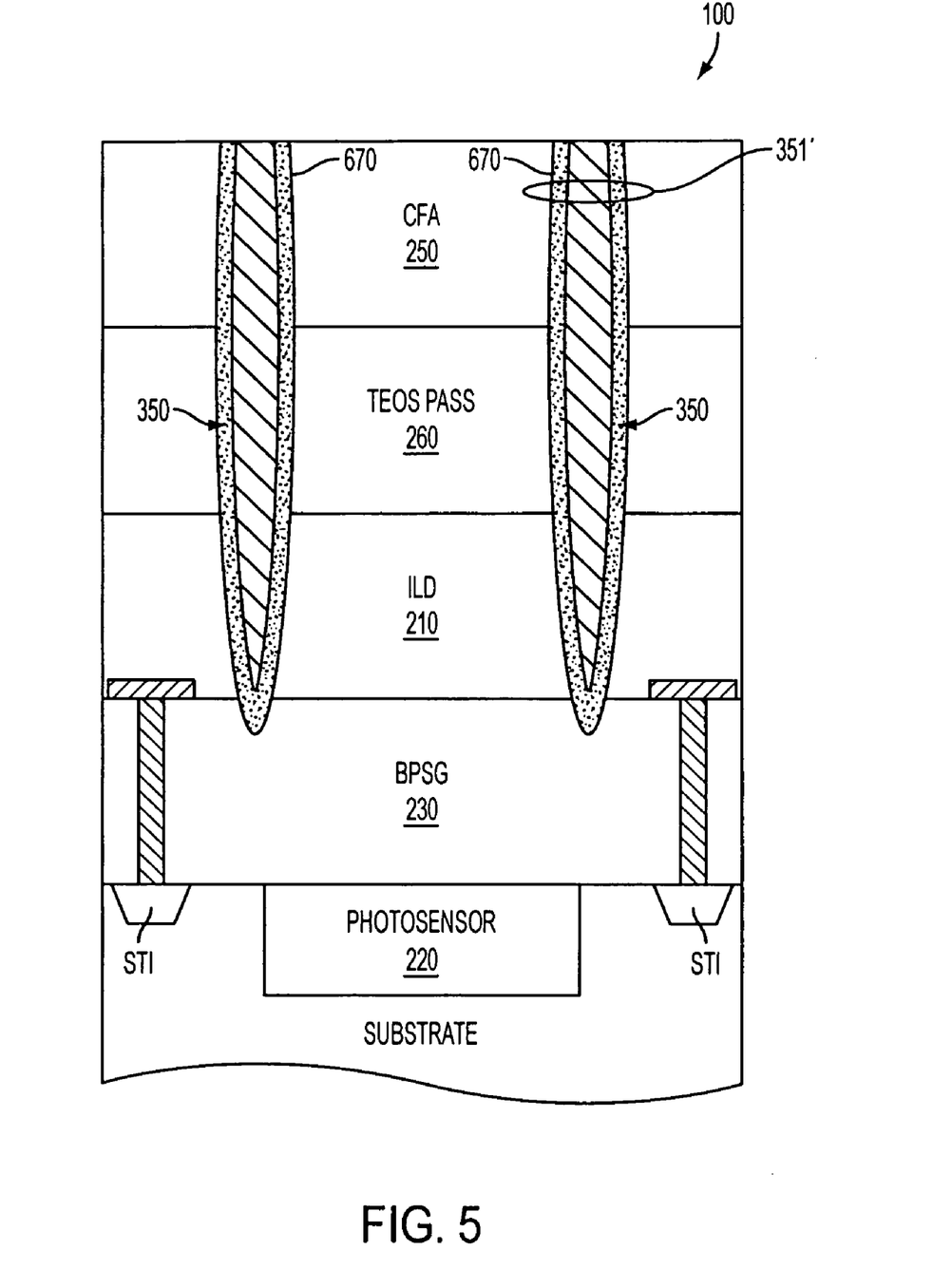
FIG. 5 shows the optical guide structure in accordance with another exemplary embodiment of the invention.
Figure 6:
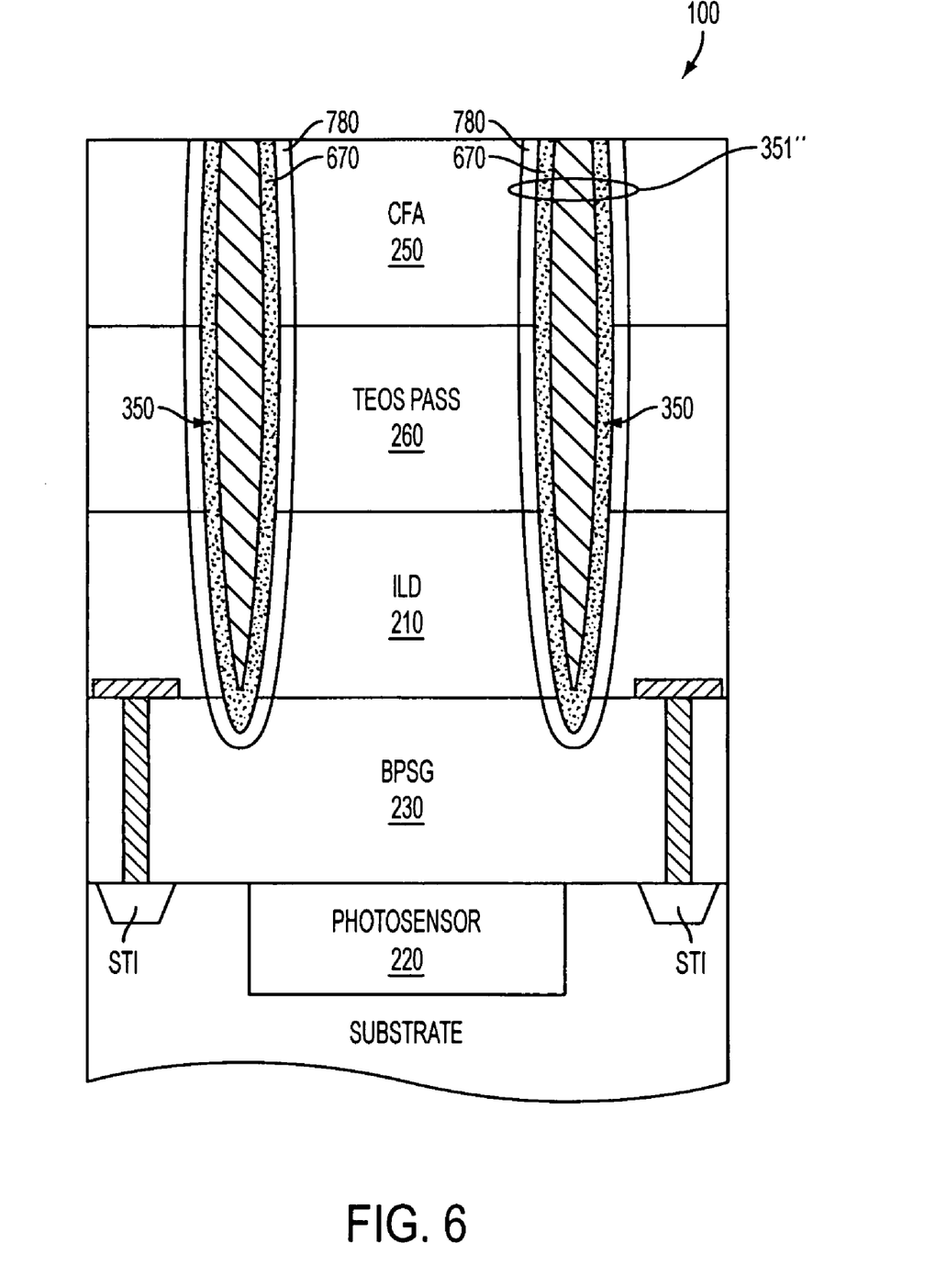
FIG. 6 shows the optical guide structure in accordance with another exemplary embodiment of the invention.

FIG. 5 illustrates a modification of the embodiment shown in FIG. 4 in which the trench contains multiple layers of fill material 351'. Two fill material 351' layers 670, 780 are shown in FIG. 6. FIG. 6 illustrates a fill material 351" formed of these layers 440, 670, 780 of different materials. However, the number of layers used for the fill material in trench 350 is in no way limited by these examples.

It should be appreciated that in the exemplary embodiment discussed above the trench 350 has been described as extending to and through the ILD layer 210, passivation layer 260, and CFA layer 250, however it may be extended from or continue into additional layers. For example referring back to FIG. 3, trench 350 may begin at the level of micro-lens layer 240, or at the level of passivation layer 270. In other words, the trench 350 may extend through any other layer included within the image sensor between the photosensor layer 220 and the micro-lens layer 240. The invention may be used in solid state imagers employing various kinds of photosensors formed on a substrate in photosensor layer 220, including but not limited to photodiodes, photo transistors, photoconductors, and photogates.

In all of the described embodiments, there is a difference in refractive index between the surrounding film material (refractive index=$n_1$) and the material 351 (FIG. 4), 351' (FIG. 5), 351" (FIG. 6) used to fill the trench 350 (refractive index=$n_2$). If $n_1$ is greater than $n_2$, for large angles of incidence of the incident light there is total internal reflection, and a considerable reduction in optical crosstalk.

In general, low dielectric constant materials will provide low refractive indexes. The various exemplary embodiments may use various materials alone (FIG. 4), or in combination (FIGS. 5, 6) as the fill material 351, 351', 351" within the trench 350 such as those that have predominantly oxide properties such as $SiO_2$/TEOS, Spin-cn-dielectric oxide (SOD), carbon doped silicon di-oxides, fluorinated silica glass oxide (FSG), etc. However, other commercially available materials can also be used such as SiLK, FLARE 2.0, Black Diamond Corel, PSiLK, Orion, LKD 5109 and XPX. It should be appreciated that this list of materials is in no way exhaustive of possible materials that can be used for filling the trench 350 of the optical guide structure, as the important point is that the index of refraction of the trench 350 fill material is lower than that of the material layers surrounding trench 350 along the optical path 223. It should be understood that any optical transparent material with a suitable index of refraction can be used as ILD material and trench fill material as long as the fill material used in the trench has a lower index of refraction compared to the material surrounding the trench. It should also be understood that any optical transparent material with a suitable index of refraction can be used as ILD material and trench fill material as long as the fill material used in the trench has a higher index of refraction compared to the material surrounding the trench. The desired reflection properties of the optical guide can come about from any such difference, higher or lower, in the index of refraction from that of the surrounding layers and that of the optical guide.

Additionally, the typical materials used for the various layers 210, 260, 250, 270 may have a relatively low index of refraction. To improve the difference in the index of refraction between the fill material 351, 351', 351" and the surrounding material, the surrounding layers, e.g., 210, 260, 250, 270 may be formed with materials having a relatively high index of refraction, thus expanding the number of possible materials having a lower index of refraction, which can be used for the trench 350 fill material.

In another embodiment of the invention, fill materials with high light reflectivity such as metals may also be used to fill the trench 350. Some metals have a very high light reflectivity such as aluminum, copper, silver and gold and can effectively serve as an optical barrier material. It should be appreciated that the metals mentioned are in no way an exhaustive list of possible metals which can be used, and metal alloys may also be used. The metal fill material may be used alone as fill material 351 (FIG. 4), or it may be layered fill material 351', 351" in the trench 350, as shown in FIGS. 5, 6. In addition, one or more reflective metal layers may be used in a layer of combination within trench 350 with layers of the non-metal materials discussed above.

Figure 7:
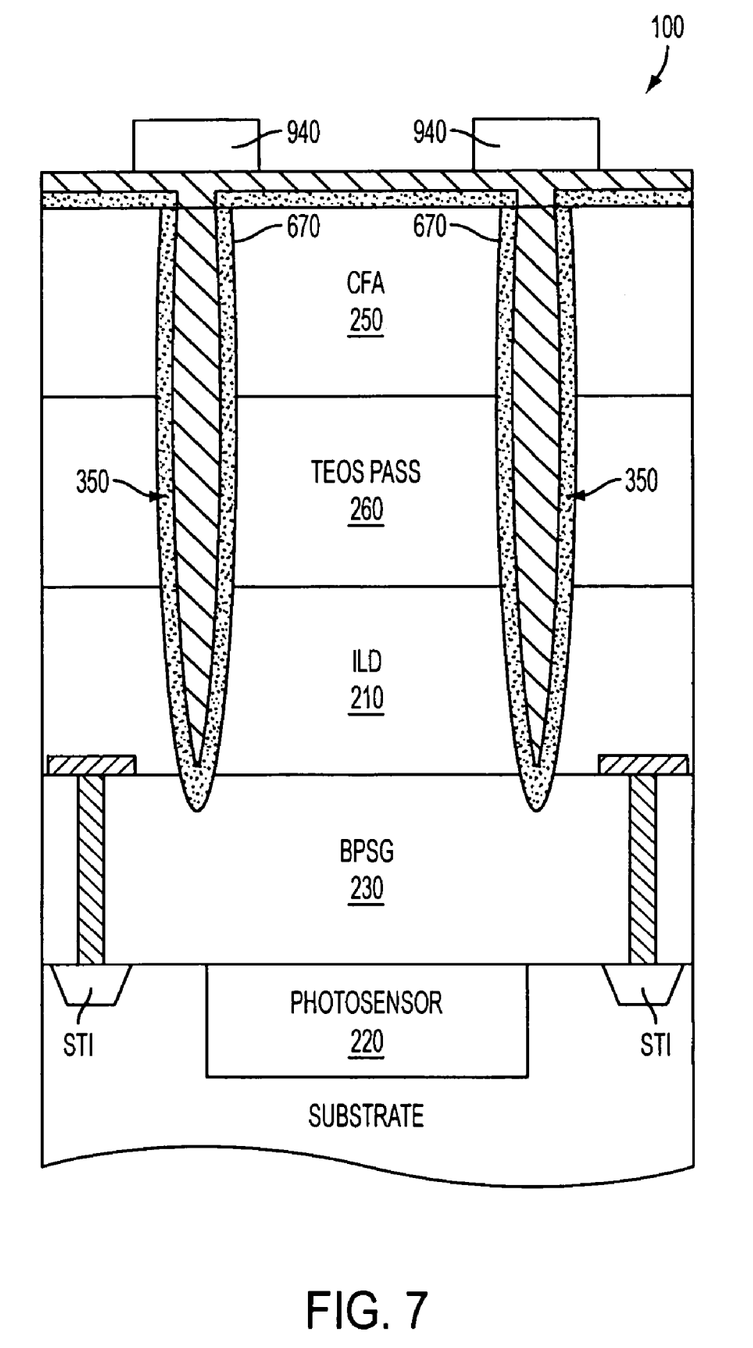
FIG. 7 shows the optical guide structure in accordance with the exemplary embodiment of the invention within a CMOS process.
Figure 8:
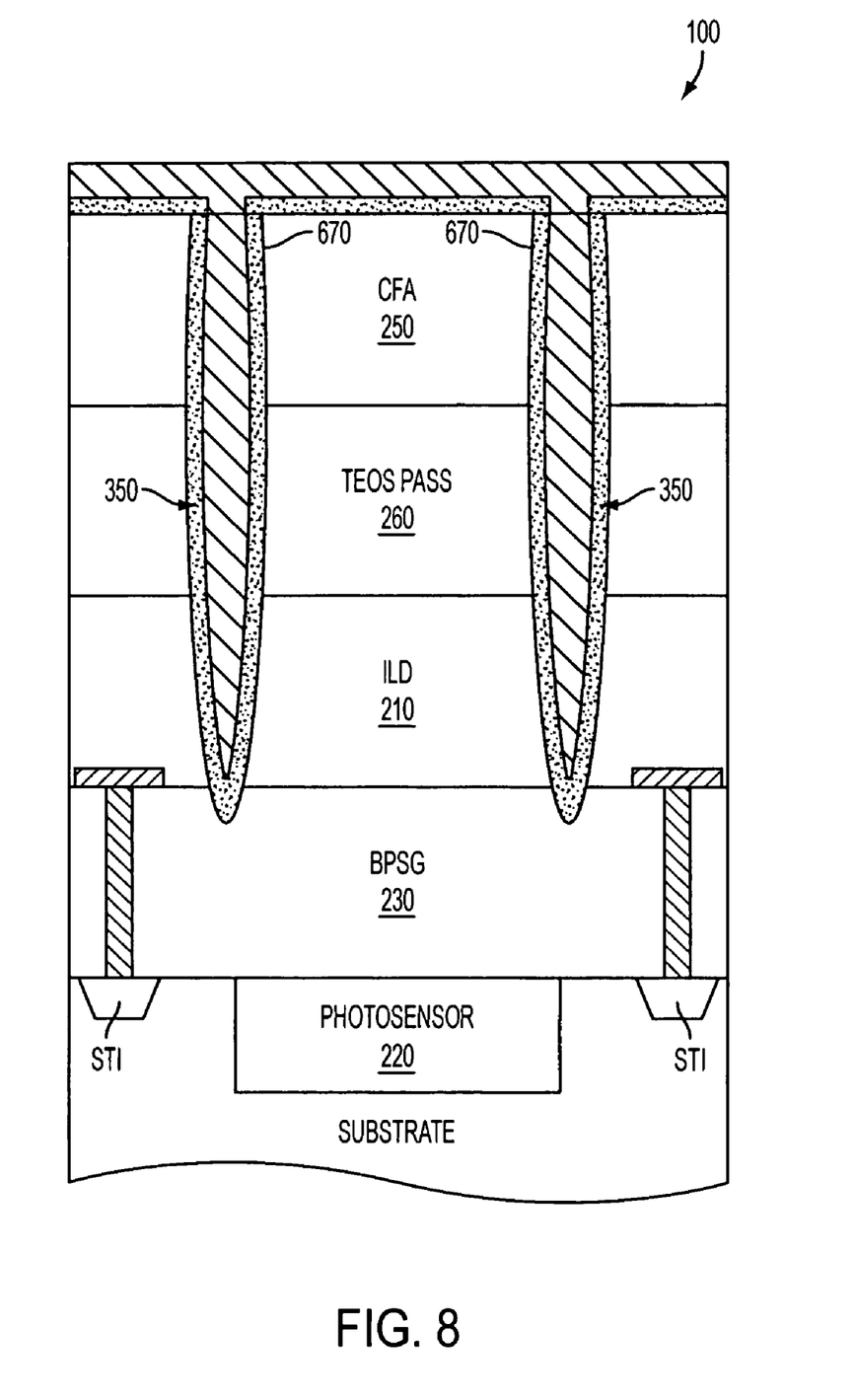
FIG. 8 shows the optical guide structure in accordance with another exemplary embodiment of the invention within a CMOS process.
Figure 9:
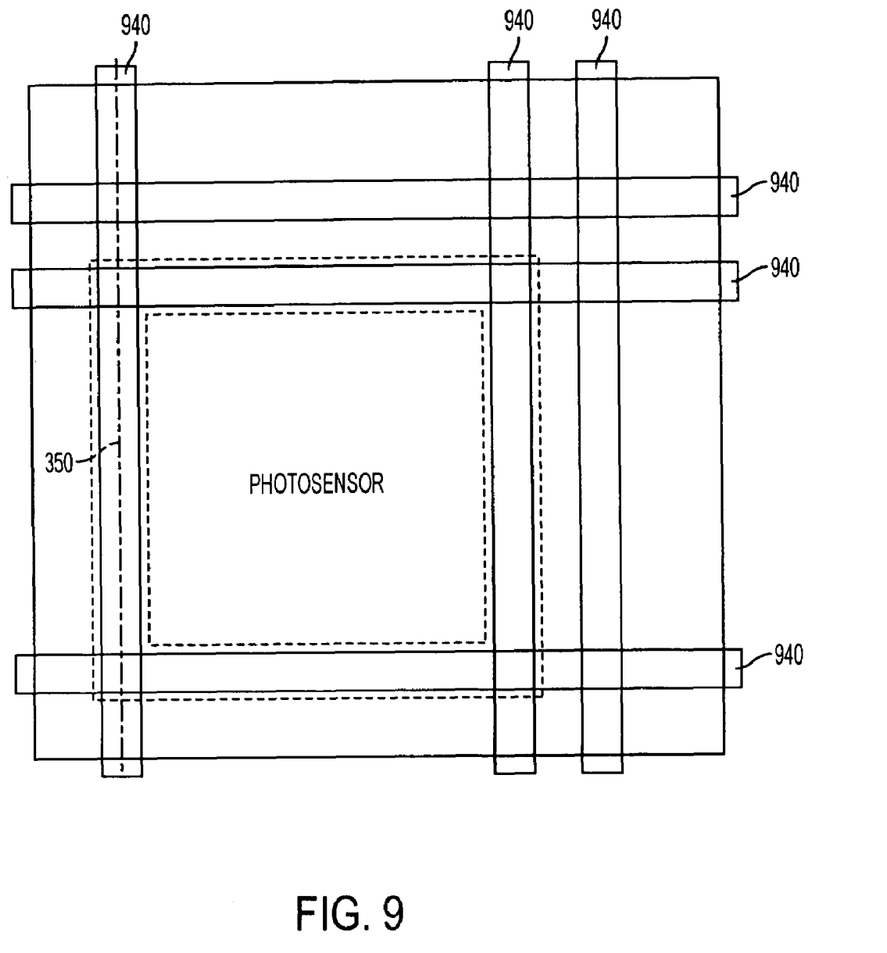
FIG. 9 shows the optical guide structure in accordance with another exemplary embodiment of the invention within a CMOS process.

FIG. 7 illustrates an embodiment in which the trench 350 fill material is not planarized after the trench fill process. Using the FIG. 4 multi-layer fill 351' as an example, after trench 350 is etched into the various layers and filled with the low-dielectric constant materials, the fill materials are not planarized leaving the fill materials extending from the outer edges of the trench 350 over the layer 250. A patterned metal layer 940 may also be placed above the trenches 350, alone or multiple levels, as shown in FIG. 8 to serve as an etch stop layer for subsequent processing and/or to also provide a light shield. FIG. 9 shows a top down view of FIG. 8 with the patterned metal layer 940.

Figure 10:
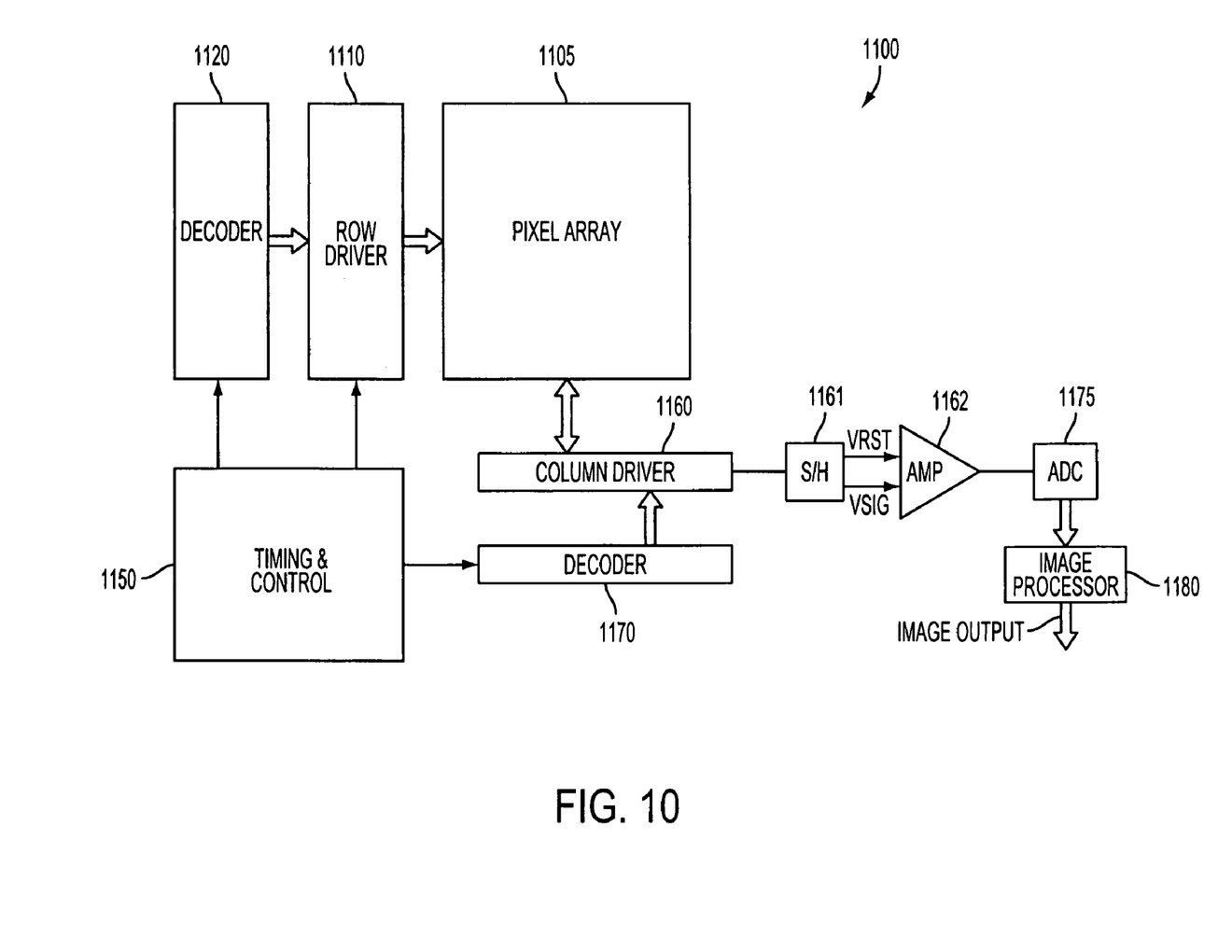
FIG. 10 shows a CMOS image sensor constructed in accordance with an embodiment of the invention.

FIG. 10 illustrates an exemplary CMOS imager 1100 that may utilize the invention. The CMOS imager 1100 has a pixel array 1105 comprising pixels constructed to include the overlying optical structure in accordance with the invention. The CMOS pixel array circuitry and potation are conventional and are only briefly described herein. Each pixel of the array includes a known four transistor (4T) pixel. Array row lines are selectively activated by a row driver 1110 in response to row address decoder 1120. A column driver 1160 and column address decoder 1170 are also included in the imager 1100. The imager 1100 is operated by the timing and control circuit 1150, which controls the address decoders 1120, 1170.

A sample and hold circuit 1161 associated with the column driver 1160 reads a pixel reset signal Vrst and a pixel image signal Vsig for selected pixels. A differential signal (Vrst−Vsig) is amplified by differential amplifier 1162 for each pixel and is digitized by analog-to-digital converter 1175 (ADC). The analog-to-digital converter 1175 supplies the digitized pixel signals to an image processor 1180 which forms a digital image.

Figure 11:
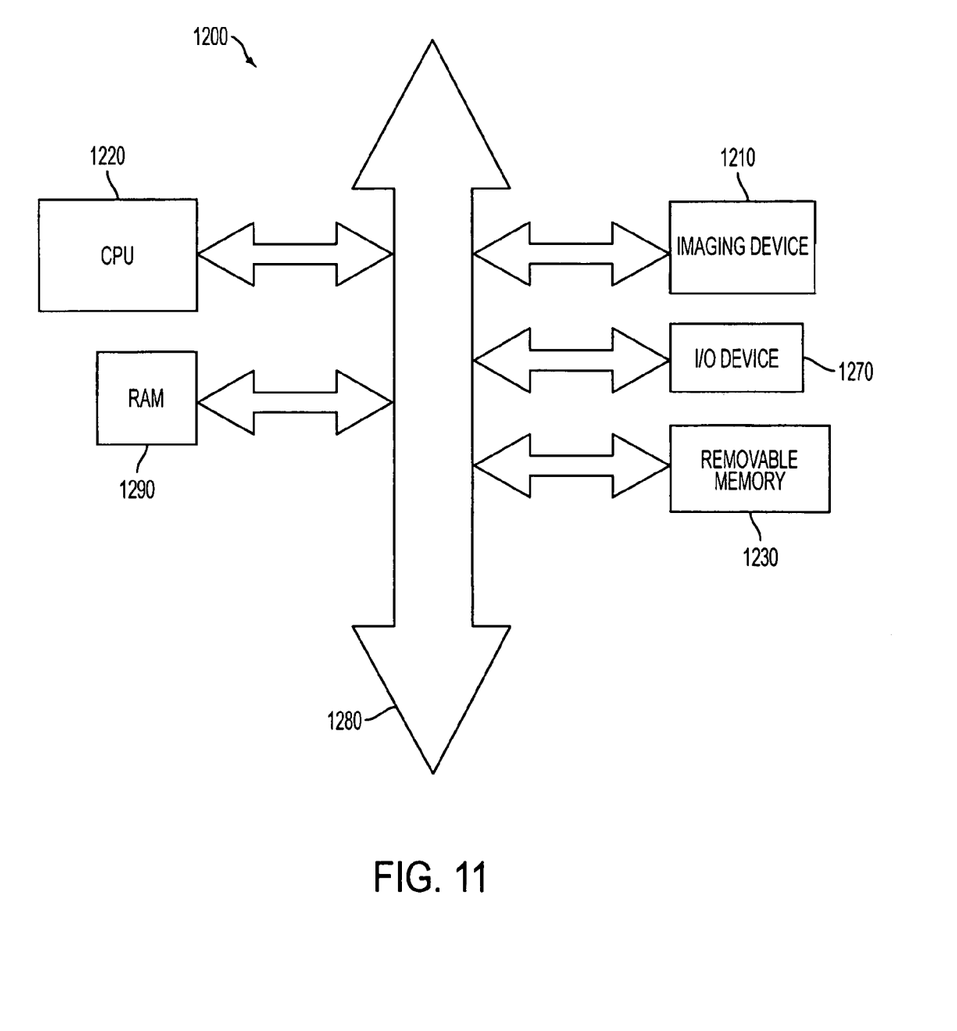
FIG. 11 shows a processor system incorporating at least one imager constructed in accordance with the exemplary embodiment of the invention.

FIG. 11 shows a system 1200, a typical processor system modified to include an imaging device 1210 (such as the imaging device 1100 illustrated in FIG. 10) of the invention. The processor system 1200 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other systems employing an imager.

System 1200, for example a camera system, generally comprises a central processing unit (CPU) 1220, such as a microprocessor, that communicates with an input/output (I/O) device 1270 over a bus 1280. Imaging device 1210 also communicates with the CPU 1220 over the bus 1280. The processor-based system 1200 also includes random access memory (RAM) 1290, and can include removable memory 1230, such as flash memory, which also communicate with the CPU 1220 over the bus 1280. The imaging device 1210 may be combined with a processor, such as a CPU, digital signal processor, or microprocessor, with or without memory storage on a single integrated circuit or on a different chip than the processor.

It should be appreciated that there are likely many alternatives for materials that may be suitably employed to provide the optical guide for integrated image sensors including metals, polymers, semiconductors, and dielectric. This is especially true if a material other than amorphous silicon dioxide is used in the ILD layers.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letter Patent of the United States is:

1. A pixel comprising:
   a photo-conversion device formed over a substrate;
   a lens over said photo conversion device;
   a plurality of fabricated layers between said photo-conversion device and lens, wherein one layer of said plurality of fabricated layers comprises a color filter array layer; and
   an optical guide structure formed in at least a portion of said plurality of fabricated layers, the portion of said plurality of fabricated layers including said color filter array layer, said optical guide structure comprising:
      a trench formed within at least a portion of said plurality of fabricated layers to define said optical guide structure;
      an optical path defined by an area enclosed by said trench; and
      a material filling said trench, said material filling said trench having a property of producing reflection of light within said optical guide structure, said property being a higher refractive index than another material forming said plurality of fabricated layers.

2. The pixel of claim 1, wherein said material has a dielectric constant less than 1.45.

3. The pixel of claim 1, wherein said material comprises carbon doped silicon dioxides.

4. The pixel of claim 1, wherein said material comprises fluorinated silica glass oxide.

5. The pixel of claim 1, wherein said material comprises metal.

6. The pixel of claim 5, wherein said material comprises silver.

7. The pixel of claim 5, wherein said material comprises copper.

8. The pixel of claim 1, wherein said trench extends from a level below a level of said lens to a level above said substrate.

9. The pixel of claim 8, wherein said level below a level of said lens comprises a clear polymide layer.

10. The pixel of claim 8, wherein said level below a level of said lens comprises a color filter array layer.

11. The pixel of claim 8, wherein said level above said substrate comprises an interlayer dielectric layer.

12. The pixel of claim 8, wherein said level above said substrate comprises a boron-phosphorous silicon glass layer.

13. The pixel of claim 1, wherein said photo-conversion device is a photosensor.

14. The pixel of claim 1, wherein said photo-conversion device is a photo emitter.

15. The pixel of claim 1, further comprising a patterned metal layer placed above said trench.

16. The pixel of claim 15, wherein said patterned metal layer forms a light shield.

17. The pixel of claim 1, wherein said trench is continuous and symmetrically surrounds a lateral area of said photo conversion device.

18. The pixel of claim 1, wherein said optical path is centered over said photo conversion device and has a cross sectional area defined by said photoconversion device.

19. An image sensor comprising:
   a pixel array, at least one pixel of said pixel array comprising:
      a photosensor;
      a lens for receiving incident light;
      a plurality of fabricated layers, between said lens and photosensor, said plurality of fabricated layers having a color filter array layer, and said lens and photosensor defining an optical path through said plurality of fabricated layers; and
      an optical guide structure formed in said plurality of fabricated layers, said optical guide structure comprising:
         a trench for defining said optical guide structure formed within at least a portion of said plurality of fabricated layers, including at least a portion of said color filter array layer;
         an optical path defined by an area enclosed by said trench; and
         a plurality of filling materials to fill said trench, said plurality of filling materials having a higher refractive index than said plurality of fabricated layers surrounding said trench producing the reflection of light within said optical guide structure, and
         wherein said plurality of filling materials comprises at least a first material and a second material, said first material being formed along a sidewall of said trench and said second material being formed inside said formed first material.

20. The image sensor of claim 19, wherein each trench is formed to surround a lateral area defined by said photosensor.

21. The image sensor of claim 19, wherein said material has a low-dielectric constant less than 1.45.

22. The image sensor of claim 19, wherein said material comprises a metal.

23. The image sensor of claim 19, wherein said trench extends from a level below a level of said lens to a level above said substrate.

24. The image sensor of claim 19, further comprising a patterned metal layer placed above said trench.

25. The image sensor of claim 19, wherein said patterned metal layer forms a light shield.

26. An imaging device comprising a CMOS pixel array, at least one pixel of the array comprising:
   a photo-conversion device formed over a substrate;
   a lens over said photo-conversion device;
   a plurality of fabricated layers, including a color filter array, between said photo-conversion device and lens; and
   an optical guide structure formed in said plurality of fabricated layers, said optical guide structure comprising:
      a trench formed within at least a portion of said plurality of fabricated layers, including at least a portion of said color filter array, to define said optical guide structure; and an optical path defined by an area enclosed by said trench;

wherein said trench is comprised of a first material and a second material, said first material being formed along a sidewall of said trench and said second material being formed in said trench inside said formed first material, said first and second materials having a property of producing reflection of light within said optical guide structure back into said optical guide structure, said first material having a different index of refraction than said second material and said first and second materials having a higher refractive index than the plurality of fabricated layers.

27. The imager system of claim 26, wherein said trench is formed above said photo-conversion device and is continuous arounds a lateral area of said photo-conversion device.

28. The imager system of claim 26, wherein said material comprises metal.

29. The imager system of claim 26, wherein said photo-conversion device is a photosensor.

30. The imager system of claim 26, wherein said photo-conversion device is a photo emitter.

31. A method of forming an optical guide structure within a pixel cell of an imaging device, comprising the steps of:
    forming a photo-conversion device over a substrate;
    forming a plurality of fabricated layers over said photo-conversion device;
    forming a color filter array layer over said plurality of fabricated layers;
    etching a trench into said plurality of fabricated layers and at least a portion of said color filter array layer to surround an optical path over said photo-conversion device; and
    filling said trench with a material having a higher refractive index than another material forming said plurality of fabricated layers which produces an internal reflection of light within an area defined by said trench.

32. The method of claim 31, wherein said etching step comprises etching the trench to surround a lateral area defined by the photo-conversion device.

33. The method of claim 31, wherein said etching step comprises etching the trench from a level below a level of a lens formed above said plurality of fabricated layers, to a level above said substrate.

34. The method of claim 31, further comprising the step of forming a patterned metal layer.

35. A pixel comprising:
    a plurality of fabricated layers, including a color filter array layer; and
    an optical guide structure formed in at least a portion of said plurality of fabricated layers, said optical guide structure comprising:
        a trench formed within at least a portion of said plurality of fabricated layers, including at least a portion of said color filter array layer, to define said optical guide structure;
        an optical path defined by an area enclosed by said trench; and
        at least two filling materials inside said trench, a first of said filling materials being formed along a sidewall of said trench and each of said remaining filling materials being formed within said formed first material, each of said filling materials being formed having a property of producing reflection of light within said optical guide structure, said property being a higher refractive index than a material forming any of said plurality of fabricated layers.

36. A method of forming an optical guide structure within a pixel of an imaging device, said method comprising:
    forming a photo-conversion device over a substrate;
    forming a plurality of fabricated layers over said photo-conversion device, wherein said plurality of fabricated layers includes a color filter array layer;
    etching a trench into said plurality of fabricated layers including said color filter array layer to form an optical path over said photo-conversion device; and
    filling said trench with a material having a property of producing reflection of light within said optical path, said property being a higher refractive index than another material forming said plurality of fabricated layers.

* * * * *